United States Patent
Master et al.

(10) Patent No.: US 6,617,195 B1
(45) Date of Patent: Sep. 9, 2003

(54) METHOD OF REFLOWING ORGANIC PACKAGES USING NO-CLEAN FLUX

(75) Inventors: Raj N. Master, San Jose, CA (US); Mohammad Z. Khan, San Jose, CA (US); Maria G. Guardado, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/624,491

(22) Filed: Jul. 24, 2000

(51) Int. Cl.[7] .................. H01L 21/44; H01L 21/48; H01L 21/30; H01L 21/50
(52) U.S. Cl. .................. 438/107; 438/106; 438/125; 438/455; 438/612
(58) Field of Search .................. 438/106, 107, 438/108, 125, 455, 612

(56) References Cited

U.S. PATENT DOCUMENTS

| 5,561,328 A | * | 10/1996 | Massingill et al. | 257/786 |
| 6,059,894 A | * | 5/2000 | Pendse | 148/23 |
| 6,142,363 A | * | 11/2000 | Tanahashi et al. | 228/224 |
| 6,225,144 B1 | * | 5/2001 | How et al. | 438/106 |
| 6,238,948 B1 | * | 5/2001 | Ramalingam | 438/106 |
| 6,285,551 B1 | * | 9/2001 | Brandenburg et al. | 361/704 |
| 6,346,469 B1 | * | 2/2002 | Greer | 438/614 |
| 6,367,150 B1 | * | 4/2002 | Kirsten | 29/840 |
| 2002/0031866 A1 | * | 3/2002 | Jiang | 438/125 |

* cited by examiner

Primary Examiner—Caridad Everhart
Assistant Examiner—Chuong A Luu (57) ABSTRACT

A method of manufacturing a semiconductor device by attaching a flip chip die to an organic substrate using solder comprises applying no-clean flux to the flip chip die or the organic substrate; heating the flip chip die and the organic substrate to bond the flip chip die to the organic substrate, and cooling the flip chip die and the organic substrate. The step of heating the flux includes controlling oxygen and moisture content of an atmosphere surrounding the flux, preheating to a temperature of about 145° C. to about 165° C., soaking at a temperature of about 145° C. to about 165° C. for about four to about six minutes, and reflowing above the solder's melting point.

14 Claims, 5 Drawing Sheets

METHOD OF REFLOWING ORGANIC PACKAGES USING NO-CLEAN FLUX

FIELD OF THE INVENTION

The present invention relates to the manufacturing of semiconductor devices, and more particularly, to a method of using no-clean flux during the attaching of electronic components to substrates.

BACKGROUND OF THE INVENTION

Interconnection and packaging related issues are among the main factors that determine not only the number of circuits that can be integrated on an electronic computer chip ("chip"), but also the performance of the chip. These issues have gained in importance as advances in integrated circuit chip design have led to reduced feature sizes of transistors and enlarged chip dimensions. The semiconductor industry has come to realize that merely having a fast chip will not result in a fast system; it must also be supported by an equally fast and reliable package.

An increasingly important aspect of manufacturing an integrated circuit chip, also referred to as an integrated circuit die or semiconductor die, is the mounting of the die to a substrate to form a package. Essentially, the package, or packaging, supplies the chip with signals and power, and performs other functions such as heat removal, physical support and protection from the environment. Often times, the goal of this process is to provide the chip with as many input/output ("I/O") terminals as possible. Another important function is simply to redistribute the tightly packed I/Os off the chip to the I/Os of a printed wiring board.

An example of a package-chip system is the "flip-chip" integrated circuit mounted on an area array organic package. Flip-chip mounting entails placing solder bumps on a die or chip, flipping the chip over, aligning the chip with the contact pads on a substrate, and re-flowing the solder balls in a furnace to establish bonding between the chip and the substrate. This method is advantageous in certain applications because the contact pads are distributed over the entire chip surface rather than being confined to the periphery as in wire bonding and most tape-automated bonding (TAB) techniques. As a result, the maximum number of I/O and power/ground terminals available can be increased, and signal and power/ground interconnections can be more efficiently routed on the chips.

Figure 1:
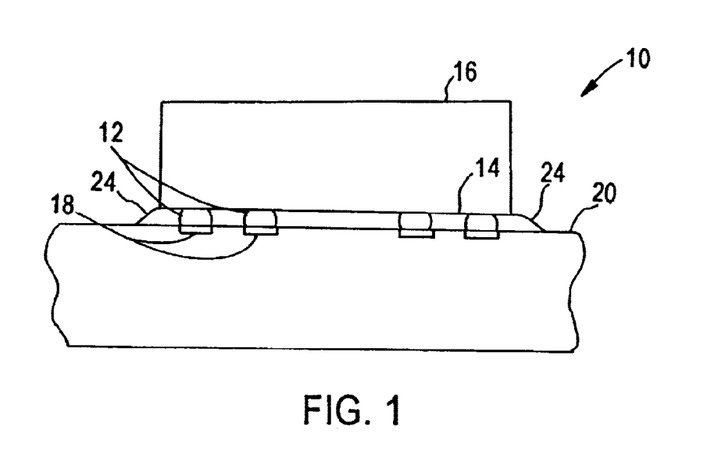
FIG. 1 is a side view of a flip-chip semiconductor device.

In the flip-chip bonding process, the die is mounted directly to the substrate. A representation of a flip-chip 10 is illustrated in FIG. 1. Generally, the flip-chip process entails forming regions of solder, e.g. solder bumps 12, on contact pads on the circuit-bearing upper surface 14 of the die 16. Such solder regions may also be formed on corresponding bonding pads 18 on the substrate 20. Flux is then applied to the solder regions on the die 16 and/or to the corresponding bonding pads 18 and/or corresponding solder regions on the substrate 20. Thereafter, the die 16 is flipped and the circuit-bearing upper surface 14 of the die 16 is brought to face the substrate 20. The solder bumps 12 on the die 16 are then brought into contact with the corresponding bonding pads 18. The resulting assembly of the die 16 and substrate 20 is then heated to melt and reflow the solder bumps 12 on the die 16. Upon cooling and re-solidification, each solder bump 12 forms a solder connection between the die 16 and the substrate 20, with the solder joint functioning as both an electrical and a physical connection. Also, the resulting solder joints between the die 16 and substrate 20 are typically encapsulated in an encapsulant 24, also known as underfilling.

The solder joints are made between solderable metallized surfaces, such as Cu, Cu plated with Pb-Sn, Ni, Ni plated with Au, and with lead solder or other solders containing Sb, Sn or Bi. Because the metallized surfaces to be bonded are typically heavily contaminated with metal oxides, carbon compounds, and other materials due to extended exposure in the manufacturing environment, the surfaces, therefore, require cleaning prior to bonding as a metallized surface contaminated by these materials is difficult to be wetted by solder. However, once this surface contamination is removed, the solder can wet the metallized surface and form a metallurgically sound solder joint.

Contaminants are typically removed from the metallized surfaces by the application of fluxes. A typical flux consists of active agents dissolved or dispensed in a liquid carrier, such as a flux paste. The carrier for flux is typically alcohol-based, with varying concentrations of acids or salts as activators. The function of the activators is to reduce base metal oxides. The flux has a variety of purposes, which include removing oxides from the metallization; removing oxides on the molten solder to reduce the surface tension and enhance flow; inhibiting subsequent oxidation of the clean metal surfaces during soldering; and assisting in the transfer of heat to the joint during soldering.

Many problems associated with the flip-chip process are generated by use of flux. Depending upon the type of flux, a flux residue remains after reflow welding during which the solder joint is formed. The residue can comprise a carrier, such as rosin or resin that is not evaporated, acid or salt deposits, and the removed oxides. If not removed, this residue can be detrimental to the long-term reliability of an electronic package. The resin can also absorb water and become an ionic conductor, which could result in problems such as electrical shorting, noise generation, and corrosion. Additionally, the residual activator can, over a period of time, corrode the soldered components and cause electrical opens.

The use of fluxes that leave corrosive and/or hygroscopic residues require a process to remove these residues to maintain the reliability of the electronic package. Typical post-soldering cleaning processes use chlorinated fluorocarbons (CFCs), organic solvents, semi-aqueous solutions, or water. However, many of these processes result in emission of CFCs and waste water, which detrimentally add to environmental pollution and production costs. In order to preserve the earth environment, the use of such CFCs has been regulated throughout the world. As an alternative to CFCs, non-regulated cleaning agents have been used. However, such cleaning agents are typically not sufficient to remove flux residue; and therefore, use of these cleaning agents cannot maintain the reliability of the electronic package.

In recent years, commercial interest in "no-clean" and low residue fluxes has significantly increased. The interest has moved from the simple desire to leave no visible residue to the unaided eye, to actually measuring the extent of ionic residue, even if it cannot be seen with the unaided eye. Initially, "no-clean" fluxes did not require post-soldering cleaning with environmentally unfriendly cleaners, as for example CFCs or chlorinated solvents, which rosin-based fluxes normally require. However, such no-clean fluxes can leave a residue that is visible. Thus, if any residue was left, it could be readily removed by rinsing with water or some other environmentally friendly solvent. Most recently, however, cleanliness requirements have increased, and a truly low residue flux, by current standards, leaves little or no measurable ionic or organic residue, even when no residue can be seen with the unaided eye.

Underfilling has been used to solve a problem in flip-chip mounting caused by a mismatch commonly found between the coefficient of thermal expansion of the semiconductor die and that of the substrate. Because of thermal gradients experienced by the semiconductor device during normal operation, the solder bumps which couple the die to the substrate experience significant stresses. These stresses can cause thermal fatigue and connection failures. Underfilling has been commonly used to overcome the thermal mismatch between the die and the substrate. This process involves inserting an encapsulation material, such as epoxy resin or other material, into the space between the semiconductor die and substrate after the die has been soldered to the substrate. In addition to being inserted into the space, surface tension produces a capillary action between the die and the substrate which pulls the epoxy into the space. This encapsulation material surrounds the solder bumps and mechanically couples the die and the substrate, thereby decreasing the stress in the solder joints to improve the lifetime of the semiconductor device.

Figure 2:
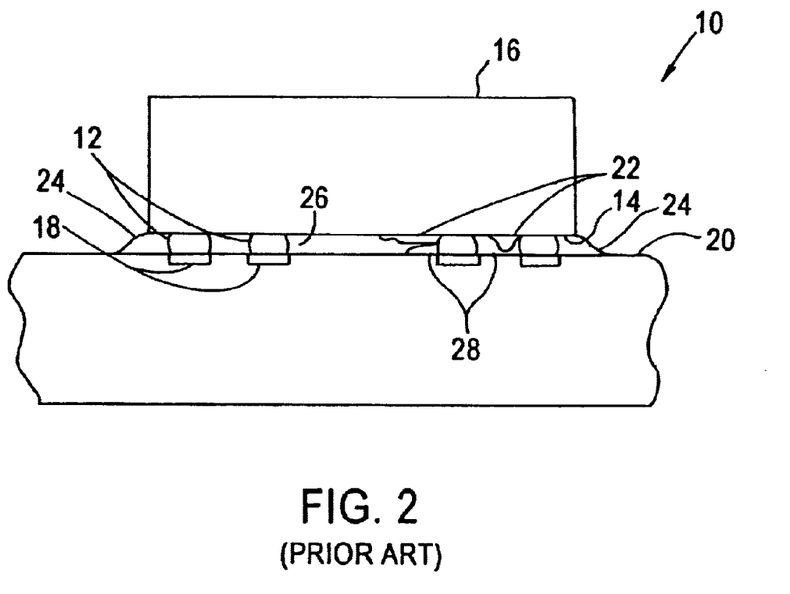
FIG. 2 is a side view of a flip-chip semiconductor device after reflow and underfilling in accordance with prior art methods.
Figure 3:
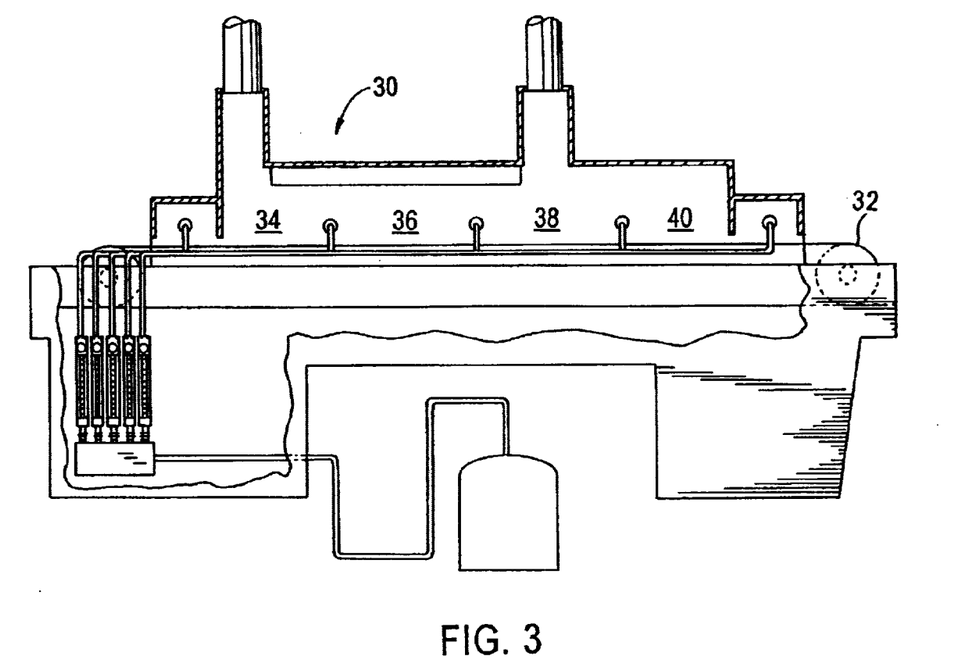
FIG. 3 is a schematic of a reflow furnace.

The use of no-clean fluxes before underfilling, however, can result in voids in the encapsulation material. In accordance with prior art methods, as illustrated in FIG. 2, the distance between the semiconductor die 16 and the substrate 20 is very small, for example 3 mils or smaller, and any significant residue 22 left by the no-clean flux after reflow can block access of the encapsulation material 24 into the space 26 between the semiconductor die 16 and substrate 20. Therefore, although this residue 22 may otherwise be benign, the blocking caused by the residue 22 can cause voids 28 in the encapsulation material. Voids 28 are a problem because any void 28 in the encapsulation material 24 adjacent a solder bump 12 reduces the stress-relieving properties of the encapsulation material 24. Accordingly, a need exists for an improved no-clean flux that reduces or eliminates the residues produced after the reflow process.

Reflow furnaces are used for the reflowing of solder, also known as reflow welding, during the assembly of semiconductor devices by the surface mounting of electrical components to a circuit board or other substrate. With reference to FIG. 1, a typical reflow furnace 30 according to the prior art is illustrated. The furnace 10 includes a conveyor belt 32 for passing the electronic components into a number of different zones 34, 36, 38, 40, which are generally divided into a preheat zone 34, a soak zone 36, a reflow zone 38, and a cooling zone 40.

Figure 4:
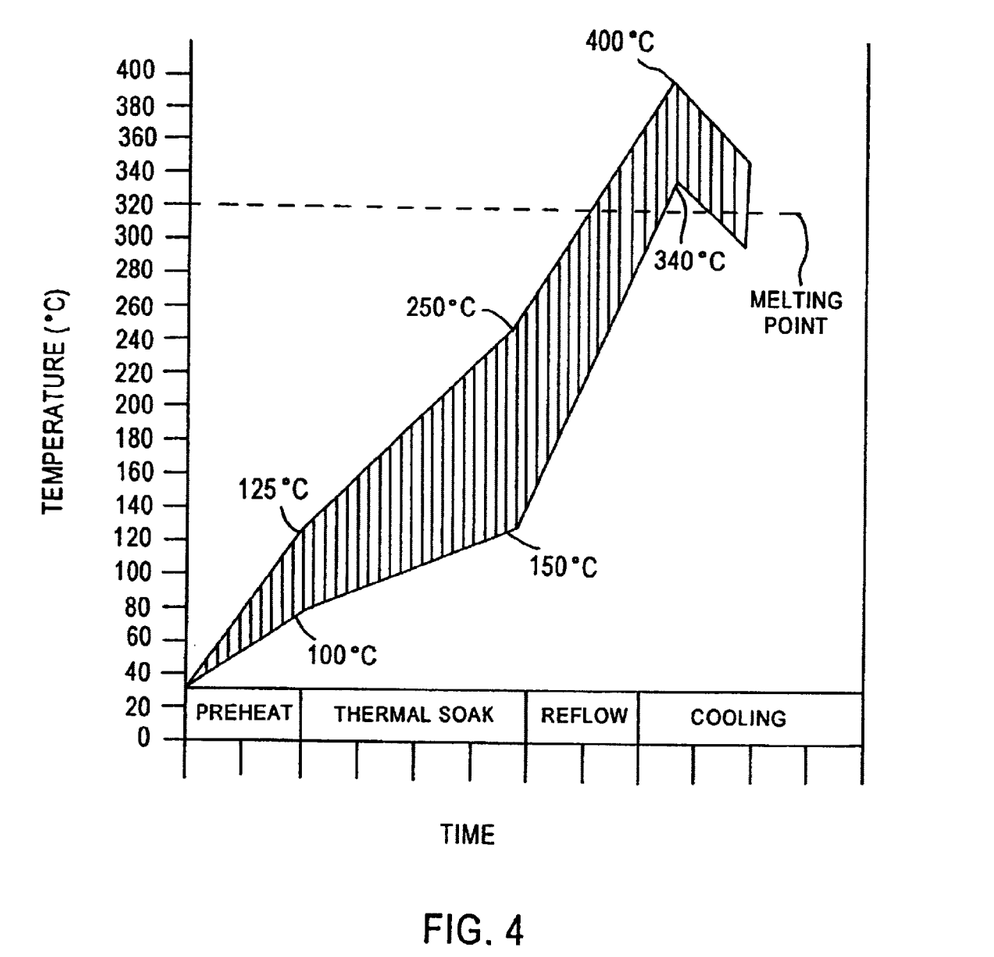
FIG. 4 is a temperature profile during reflow welding for a ceramic package in accordance with prior art methods.

Many of the packaging used today is ceramic, and a temperature profile during reflow welding for a ceramic package is illustrated in FIG. 4. Upon entering the preheat zone 34, the initial heating of the circuit board begins. The process window for the preheat zone 34 is a 1° to 3° C./second rise in temperature to between 100° C. to 125° C. During this time, the solvent in the flux begins to evaporate. In the thermal soak zone 36, the circuit board is raised to 150° C. to 250° C. in about 60 to 120 seconds. This exposure allows the flux to dry and activate. In the reflow zone 38, the solder is heated to above its melting temperature thereby reflowing to form solder joints. The time during which a solder joint is molten is approximately 60 to 120 seconds, and the peak temperature of the leads in the solder joints is typically 360° C.±20° C. Upon reaching the cooling zone 40, the circuit board is cooled at a rate not more than 4° C./second, during which time the solder joints solidify. These profile times and temperatures can vary depending upon the type of semiconductor device, circuit board size, board density, throughput requirements, type of reflow equipment, and solder paste.

The current trend, however, in integrated circuit chip packaging technology is to shift from thick ceramic packaging to relatively thinner organic substrate-based packaging for single chip modules (SCMs) and multi-chip modules (MCMs). However, organic packaging has a higher sensitivity to elevated heat profiles. Because of this sensitivity to elevated heat, the temperature profile during reflow welding for an organic package is different that the temperature profile during reflow welding for a ceramic package. This different temperature profile for organic packages causes problems with the use of no-clean fluxes.

No-clean fluxes depend upon high temperatures to volatilize their constitutes to thereby leave little or no residue. As such, when a given no-clean flux is exposed to a reduced temperature profile, all of the constituents within the flux cannot completely volatilize. The constituents that remain are residue, which has the detrimental affects previously discussed. Accordingly, a need exists for an improved flux for use with organic packages that leaves little or no residue and is active at low temperatures.

SUMMARY OF THE INVENTION

This and other needs are met by embodiments of the present invention which provide a method of attaching a die to a substrate using solder to form a semiconductor device. This method comprises applying flux to the die or the substrate; heating the die and the substrate to bond the die to the substrate, cooling the die and the substrate, and underfilling between the die and the substrate. The step of heating the flux includes controlling oxygen and moisture content of an atmosphere surrounding the flux, preheating to a temperature of about 145° C. to about 165° C., soaking at a temperature of about 145° C. to about 165° C. for about four to about six minutes, and reflowing above the solder's melting point.

In further embodiments of the invention, the flux is a no-clean flux, the substrate is an organic substrate, and the die is a flip-chip. Additionally, the temperature increase during the preheating is at a rate no greater than 50° C./minute. Also, the temperature increase during the reflowing is at a rate between about 30° C./minute about 60° C./minute. During the cooling phase, the die cooled at a rate not more than 50° C./minute. The solder is typically molten for about one minute to about two minutes, and the peak temperature during reflowing is between about 200° C. and about 270° C.

By having a soaking phase at temperatures from about 145° C. to about 165° C. for about four to six minutes, the present invention allows no-clean fluxes to be used with organic packaging. Furthermore, use of a no-clean flux that forms little residue negates the need for an additional cleaning step after reflow and prevents the formation of voids during any subsequent underfilling operation.

Additional advantages of the present invention will become readily apparent to those skilled in this art from the following detailed description, wherein preferred embodiments of the present invention are shown and described, simply by way of illustration of the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DETAILED DESCRIPTION OF THE INVENTION

The present invention addresses and solves the problem of residue formed on semiconductor devices after reflow. This problem is particularly prevalent during the attachment of a semiconductor die to an organic substrate because organic substrates are particularly sensitive to high temperatures. The problem is achieved in part, by providing a no-clean flux capable of volatilization and degradation at temperatures from about 145° C. to about 165° C. Advantageously, by providing a flux capable of low-temperature degradation and reflowing the semiconductor die and organic substrate at a particular temperature profile, which includes a hold at the previous temperature range, an additional cleaning step after reflow is not required and the formation of voids during any subsequent underfilling operation is prevented.

Figure 5:
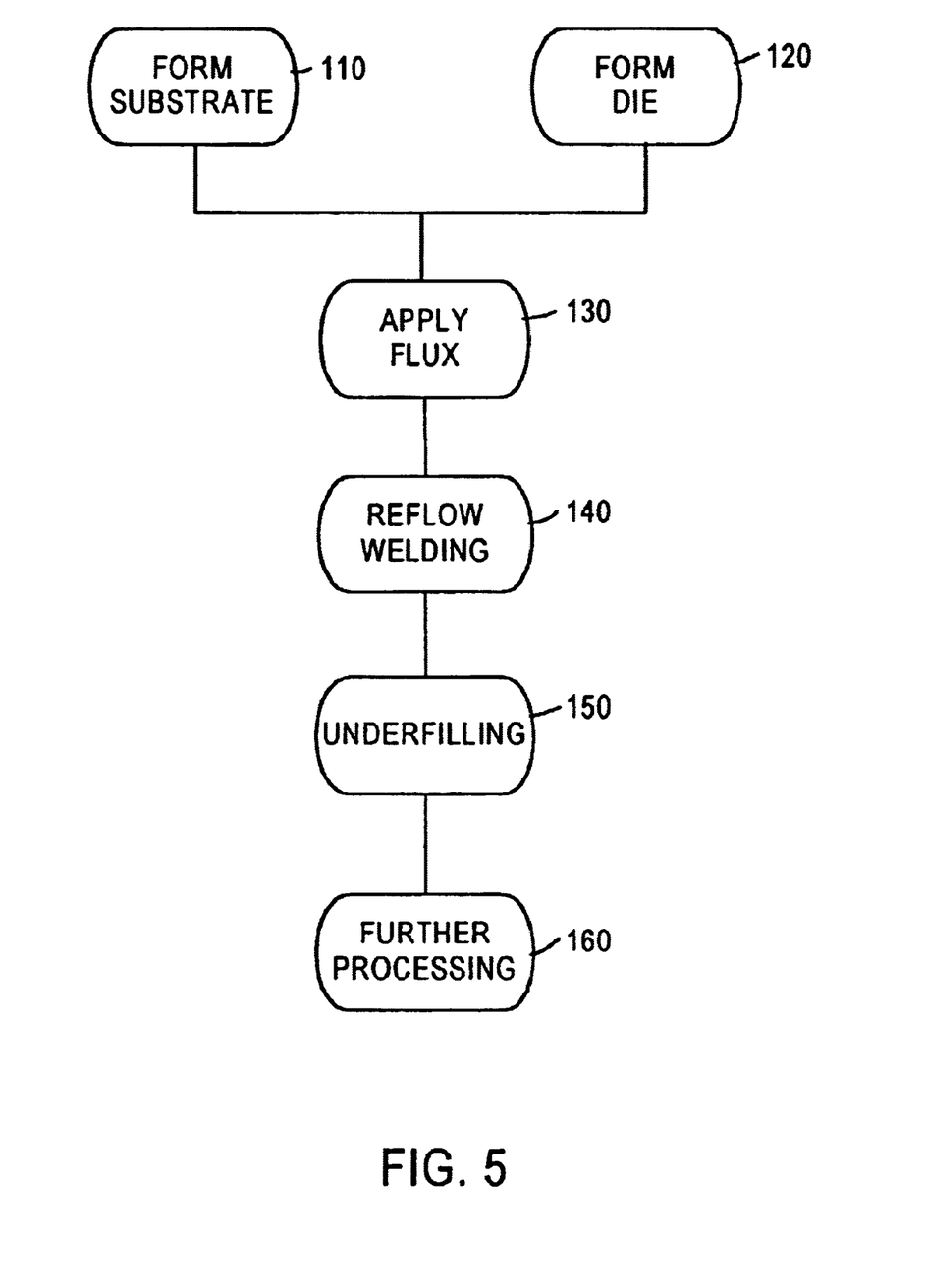
FIG. 5 is a flow chart of a method of assembling a semiconductor die and a substrate according to an embodiment of the present invention.

A flow chart illustrating a method of assembling a die and a substrate according to current embodiments of the invention is illustrated in FIG. 5. At step 110, a substrate is formed by standard methods in the semiconductor art. The substrate could be silicon, alumina (ceramic), or glass. In current embodiments, however, the substrate is formed from an organic material. The substrate also preferably includes bond pads or solder bumps.

The semiconductor die, indicated at step 120, can be formed, for example on a silicon substrate or a gallium arsenide substrate. Bonds pads or solder bumps are formed on the die and correspond to the bond pads or solder bumps formed on the substrate as discussed above. The bump material can be formed from a variety of Pb-based or Pb-free solders. Although the bond pad metallization is not limited as to a particular material, examples of bond pad metallization include Ni-Au, Cr-Cu-Au, TiW-Cu, Ti-Cu, or TiW-Au.

Flux is then applied to the die and/or substrate, as indicated at step 130. In a preferred embodiment, the flux is a no-clean flux, and therefore advantageously eliminates the need for cleaning after reflow welding. Although the flux can be a flux that requires cleaning after reflow, the use of such a flux would negate the benefit of minimizing or eliminating the residue to be cleaned because if the semiconductor device is to be cleaned after reflow, little or no advantage is gained by reducing the residue generated during reflow.

An example of a no-clean flux used with the present invention is H2O8×4 available from Indium Corporation of Utica, N.Y. This flux was developed using several criteria. The flux preferably has sufficient activity to be used in the flip chip method and sufficient activity to activate Ni-Au, Cu or soldered bond pads on the substrate as well as being capable of reducing the surface tension at the interface between the bond pads and solder bumps to provide good wetting. Also, the flux generates no residue after reflow welding. However, if any residue is generated, the residue does not interfere with the application of underfilling material or does not adversely affect the integrity of the solder joint. The flux preferably has viscosity and rheology characteristics allowing the flux to applied by conventional brushing or spraying techniques. Importantly, the flux is capable of degrading and volatilizing at low temperatures of about 145° C. to about 165° C.

Figure 6:
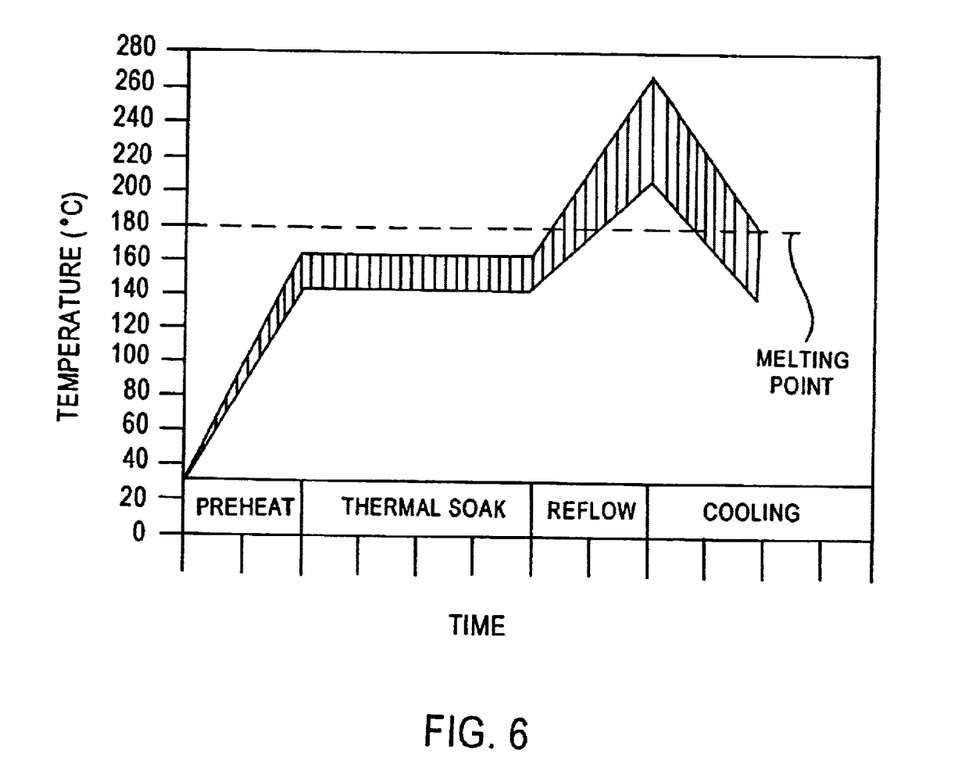
FIG. 6 is a temperature profile during reflow welding for an organic package in accordance with an embodiment of the invention.

After application of the flux, the die and substrate is reflowed welded at step 140. A temperature profile for reflow welding according to embodiments of the invention using the preferred flux with an organic package is illustrated in FIG. 6. The initial heating of the circuit board occurs during the preheat phase. During the preheat phase, the rise in temperature from room temperature to between about 145° C. to 165° C. is at a rate no greater than about 50° C./minute. During this time, the solvent in the flux begins to evaporate.

In the thermal soak phase, the circuit board is held at the temperature of 145° C. to 165° C. for about four to six minutes. During this time, the flux begins to activate. Also, the extended exposure to heat allows any remaining solvents within the flux to vaporize. This extended hold time below the melting temperature of the solder is important to minimize the amount of residue left from the flux after reflow welding.

In the reflow phase, the solder is heated to above its melting temperature, thereby reflowing to form solder joints. The temperature of the organic package is raised at a rate of about 30° C./minute to about 60° C./minute rise to increase the temperature to above the melting temperature of the solder. The time during which a solder joint is molten is approximately 60 to 120 seconds, and the peak temperature during reflow welding is typically from about 200° C. to about 270° C. During a cooling phase, the organic package is cooled at a rate not more than 50° C./minute, during which time the solder joints solidify.

Exposure of polymers in a no-clean flux to excessive amounts of oxygen and moisture causes the formation of chemical links between reactive atoms in the molecular chain of the polymer, also known as crosslinking. Crosslinking makes the polymer more resistant to high temperatures; and as such, increases the pyrolyzation temperature of the polymer. This phenomenon results in increased residue after reflow as portions of the no-clean flux fail to pyrolyze. Although these residues can be pyrolyzed at higher temperatures, the use of a no-clean flux with organic packaging limits any increase in temperature during the reflow process.

In current embodiments of the invention the moisture and oxygen content of the reducing atmosphere in the reflow furnace during reflow welding is controlled so as to minimize crosslinking in the no-clean flux, and therefore minimize or eliminate residue after reflow. Many different methods capable of controlling the moisture and oxygen content in an atmosphere are known, and any method so capable is acceptable for use with the present invention. In a presently preferred embodiment of the invention, the moisture content is controlled by measuring the oxygen and moisture content of the reducing atmosphere and alerting an operator of the reflow furnace when the moisture and oxygen contents exceeds a set amount, or threshold.

The threshold amount is preferably set below a maximum desired amount of moisture or oxygen. In this manner, when the operator is signaled that the moisture or oxygen content exceeds the threshold amount, the operator can investigate and then correct the problem before the content reaches the maximum desired amount. As such, stopping the process to purge the atmosphere is not required and the process can advantageously continue to run as the problem of increased moisture or oxygen content is being corrected.

In certain embodiments of the invention, both the oxygen and moisture content are individually controlled to be below 20 ppm, and this control is accomplished by monitoring the moisture and oxygen content in the reducing gas and alerting an operator when the moisture or oxygen content exceeds a 10 ppm threshold amount.

After reflowing welding, as indicated in step 140, an encapsulation material is applied between the substrate and die in an underfilling operation as indicated at step 150. The substrate and die is then subjected to normal manufacturing steps as indicated at step 160.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A method of manufacturing a semiconductor device by attaching a die to an organic substrate using solder, comprising the steps of:
    a) applying flux to one of the die and the organic substrate;
    b) heating the die and the substrate to bond the die to the organic substrate, the step of heating includes preheating to a temperature of about 145° C. to about 165° C., soaking at a temperature of about 145° C. to about 165° C. for about four to about six minutes, and reflowing at a temperature above the solder's melting point; and
    c) cooling the die and the organic substrate.

2. A method of manufacturing a semiconductor device according to claim 1, wherein the flux is a no-clean flux.

3. A method of manufacturing a semiconductor device according to claim 1, wherein the die is a flip chip.

4. A method of manufacturing a semiconductor device according to claim 3, further comprising the step of underfilling between the die and the substrate.

5. A method of manufacturing a semiconductor device according to claim 1, wherein said heating step further includes controlling moisture content of an atmosphere surrounding the flux.

6. A method of manufacturing a semiconductor device according to claim 5, wherein the moisture content is controlled to below about 20 ppm.

7. A method of manufacturing a semiconductor device according to claim 1, wherein said heating step further includes controlling oxygen content of an atmosphere surrounding the flux.

8. A method of manufacturing a semiconductor device according to claim 7, wherein the oxygen content is controlled to below about 20 ppm.

9. A method of manufacturing a semiconductor device according to claim 1, wherein a temperature increase during said preheating is at a rate no greater than 50° C./minute.

10. A method of manufacturing a semiconductor device according to claim 1, wherein a temperature increase during said reflowing is at a rate between about 30° C./minute and about 60° C./minute.

11. A method of manufacturing a semiconductor device according to claim 1, wherein the solder is molten for about one minute to about two minutes.

12. A method of manufacturing a semiconductor device according to claim 1, wherein a peak temperature during said reflowing is between about 200° C. and about 270° C.

13. A method of manufacturing a semiconductor device according to claim 1, wherein the die and substrate during said cooling step are cooled at a rate not greater than 50° C./minute.

14. A method of manufacturing a semiconductor device by attaching a die to an organic substrate using solder, comprising the steps of:
    a) applying no-clean flux to one of the die and the organic substrate;
    b) heating the die and the organic substrate to bond the die to the organic substrate, the step of heating includes controlling oxygen and moisture content of an atmosphere surrounding the flux, preheating to a temperature of about 145° C. to about 165° C., soaking at a temperature of about 145° C. to about 165° C. for about four to about six minutes, and reflowing at a temperature above the solder's melting point;
    c) cooling the die and the organic substrate; and
    d) underfilling between the die and the organic substrate.

* * * * *

UNITED STATES PATENT AND TRADEMARK OFFICE
CERTIFICATE OF CORRECTION

PATENT NO. : 6,617,195 B1 Page 1 of 1
DATED : September 9, 2003
INVENTOR(S) : Raj N. Master et al.

It is certified that error appears in the above-identified patent and that said Letters Patent is hereby corrected as shown below:

<u>Title page,</u>
Item [*] Notice, Term Patent Adjustment should read -- (33) days --.

Signed and Sealed this

Twenty-fifth Day of April, 2006

JON W. DUDAS
*Director of the United States Patent and Trademark Office*